US006888766B2

(12) United States Patent
Takahashi

(10) Patent No.: US 6,888,766 B2
(45) Date of Patent: May 3, 2005

(54) SEMICONDUCTOR MEMORY DEVICE PROVIDED WITH TEST MEMORY CELL UNIT

(75) Inventor: Kazuhiko Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 54 days.

(21) Appl. No.: 10/254,647

(22) Filed: Sep. 26, 2002

(65) Prior Publication Data

US 2003/0193823 A1 Oct. 16, 2003

(30) Foreign Application Priority Data

Apr. 10, 2002 (JP) .......................................... 2002-108193

(51) Int. Cl.⁷ ............................ G11C 7/24; G11C 29/00; G11C 11/22; G11C 5/02
(52) U.S. Cl. ........................ 365/201; 365/145; 365/200; 365/51
(58) Field of Search ................................ 365/201, 145, 365/117, 65, 210, 200, 51

(56) References Cited

U.S. PATENT DOCUMENTS

| 4,855,956 A | * | 8/1989 | Urai ............................ 365/210 |
| 4,972,372 A | * | 11/1990 | Ueno .......................... 365/201 |
| 6,515,923 B1 | * | 2/2003 | Cleeves ....................... 365/201 |

FOREIGN PATENT DOCUMENTS

JP    2001-077320    3/2001

OTHER PUBLICATIONS

"Low–power High–sped LSI Circuits & Technology", Realize Ltd., pp. 231–250.
"All About Non–Erasable IC Memory–FRAM", K.K. Kogyo Chosakai, pp. 29–37.

* cited by examiner

Primary Examiner—Richard Elms
Assistant Examiner—J. H. Hur
(74) Attorney, Agent, or Firm—Volentine Francos & Whitt, PLLC

(57) ABSTRACT

A semiconductor memory device includes a memory cell block composed of a memory cell unit having memory cells each containing a ferroelectric capacitor, and a test memory cell unit having test memory cells. The layout pattern of the test memory cells is identical to the layout pattern of the memory cells. The test memory cell unit is arranged close to a memory cell of a plurality of memory cells which is at a position where the ferroelectric capacitor is susceptible to degradation. The memory cell unit and test memory cell unit are subjected to a first cycling test consisting of $N_1$ cycles. Then, the test memory cell unit is subjected to a second cycling test consisting of $N_2$ cycles. The sum $(N_1+N_2)$ of the number of cycles in the first and second cycling tests equals an assurance number of cycles T, where $N_1 < N_2$.

13 Claims, 9 Drawing Sheets

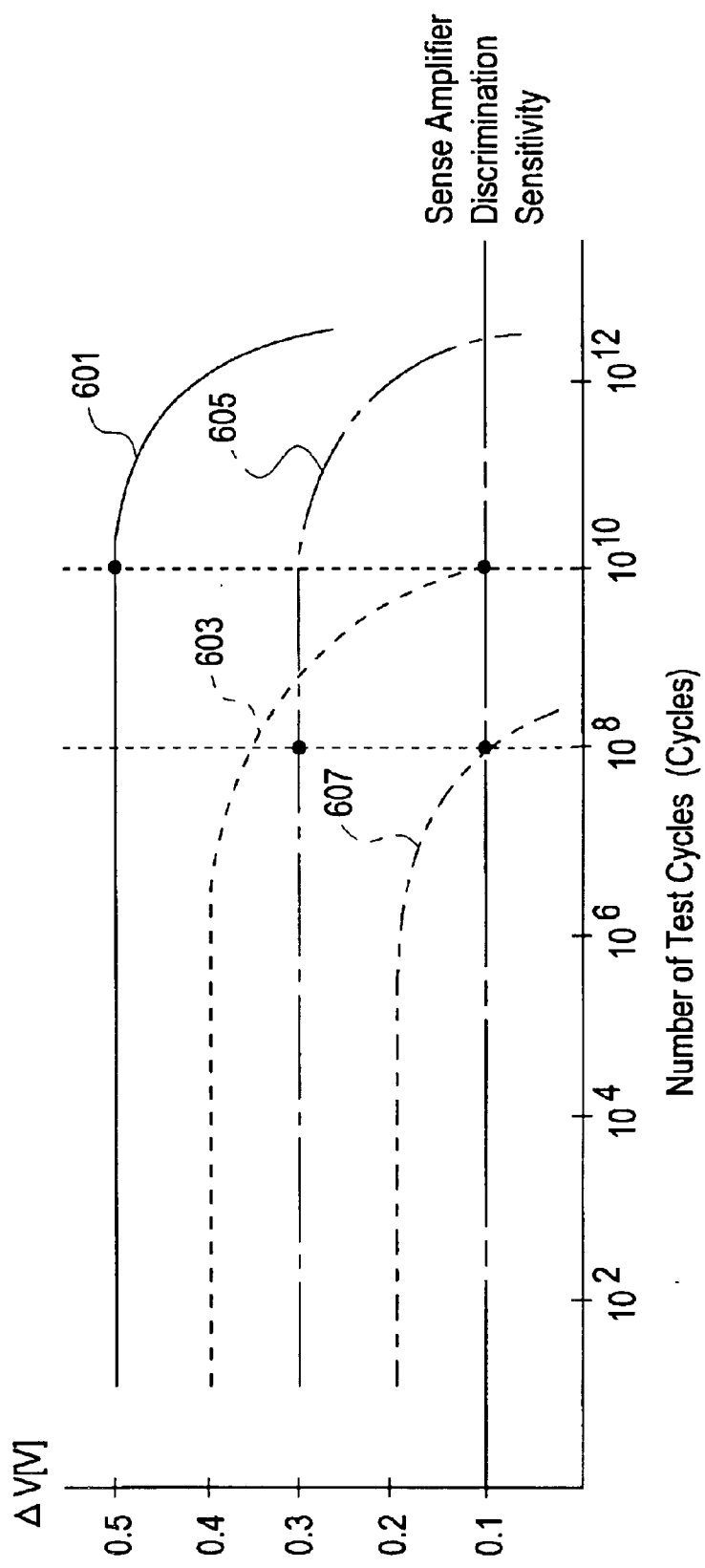

SEMICONDUCTOR MEMORY DEVICE PROVIDED WITH TEST MEMORY CELL UNIT

BACKGROUND OF THE INVENTION

1. Field of the Invention

The present invention relates to a semiconductor memory device composed of ferroelectric memories.

2. Description of Related Art

Memory cells constituting a semiconductor memory device (ferroelectric memory) using polarization of ferroelectrics are well known to be of a 2T2C type and 1T1C type, as described in Reference 1 ("Low-power High-speed LSI Circuits & Technology", Realize Ltd., pp. 231–250) and Reference 2 ("All About Non-Erasable IC Memory-FRAM", K. K. Kogyo Chosakai, pp. 29–37). The 2T2C-type memory cell is composed of two transistors and two ferroelectric capacitors, whereas a 1T1C-type memory cell is composed of one transistor and one capacitor.

The polarization state of a ferroelectric capacitor of the above-described memory cell is usually determined by a hysteresis curve, as disclosed in Reference 1. FIG. 8 shows such a hysteresis curve 18. In the figure, the polarization P ($\mu C/cm^2$) is plotted against the ordinate, and the voltage V (V) is plotted against the abscissa.

The hysteresis curve 18 shown in FIG. 8 intersects with the ordinate in A point and B point when the voltage is 0. The A point and B point represent two residual polarization quantities of the ferroelectric capacitor. Thus, depending on the two residual polarization states shown in FIG. 8, a ferroelectric capacitor holds "L" (low-level state, that is, a state without voltage, or a state with a low voltage) data or "H" (high-level state, that is, a state with a voltage) data. When the residual polarization in the ferroelectric capacitor is represented by A point, "H" data are held, and when the residual polarization is represented by B point, the "L" data are held.

The above-described memory cell is connected to a sense amplifier with a bit line. As disclosed in Reference 1 and Reference 2, the reading operation of the ferroelectric memory composed of the above-described memory cells is the same as that of DRAM (Dynamic RAM (Random Access Memory)). Therefore, the bit line voltage generated by voltage division between the ferroelectric capacitor and bit line capacity Cb is detected by the sense amplifier. Further, according to Reference 1, the bit line voltage is determined by the shape of the hysteresis curve of ferroelectric capacitor and the bit line capacity Cb.

Referring to FIG. 8, a load line 10 and a load line 12 corresponding to the two residual polarization states of ferroelectric capacitor represented by A point and B point are shown in addition to the hysteresis curve 18. The slope of those load curve 10 and load curve 12 is the bit line capacity Cb. Further, in the hysteresis curve 18, the section between the A point and E point is the region of the non-inverted response of the ferroelectric capacitor, and the section between the B point and E point is the region of the reversed response of the ferroelectric capacitor. The read-out bit line voltage V0 and bit line voltage V1 in the two memory states of ferroelectric capacitor is found from intersection point C of the load line 10 and section between the A point and E point in the hysteresis line 18, from intersection point D of the load line 12 and the section between the B point and E point in the hysteresis line 18, and from the E point. The difference ΔV between those bit line voltage V0 and bit voltage V1 should be no less than the discrimination sensitivity of sense amplifier.

The read operation of the above-described ferroelectric memory is a destructive read, similarly to DRAM. If the polarization of a ferroelectric capacitor is repeatedly reversed in the read operation and write operation of the ferroelectric capacitor, the polarization of the capacitor decreases. This effect is inherent to ferroelectric memory and is usually called a fatigue (fatigue characteristic). In FIG. 8, the hysteresis curve 20 of a ferroelectric capacitor degraded due to fatigue is shown by a dotted line. In this case, a bit line voltage V'0 and a bit line voltage V'1 can be found from intersection point C' of the load line 14 and hysteresis curve 20, from intersection point D' of the load line 16 and hysteresis line 20, and from the E point by the same procedure as described above. Here, the slope of load curve 14 and load curve 16 is also the bit line capacity Cb. The difference ΔV' between the bit line voltage V'0 and bit line voltage V'1 in the ferroelectric capacitor degraded by fatigue decreases below the above-described difference ΔV between the bit line voltage V0 and bit line voltage V1 and becomes less than the discrimination sensitivity of sense amplifier. At this time, the ferroelectric memory comprising the degraded ferroelectric capacitor is considered to be degraded.

Evaluation of the above-mentioned fatigue is typically conducted by reliability testing the device comprising the ferroelectric memory. Reliability testing that has been conventionally conducted with respect to fatigue is disclosed in Published Reference Material 1 ("Assurance of Fujitsu FRAM Quality and Reliability", 2002, Fujitsu Home Page (http://edevice.fujitsu.com/fj/CATAROG/AD00/00- 00015/1-7.html)).

A screening test is conducted as a reliability test relating to fatigue. The screening test is a test conducted to detect defective memory cells in a device. The screening test, as disclosed in Published Reference Material 1, is conducted by applying fatigue stresses by repeating the prescribed number of read and write cycles in the ferroelectric memory constituting the device and then checking whether the ferroelectric memory operates normally. This test is called a cycling test. When no defective memory cells that were degraded by fatigue of ferroelectric capacitors have been detected by the cycling test consisting of the prescribed number of cycles, this number of cycles is considered an assurance number of cycles.

However, the production devices are generally not subjected to the cycling test consisting of the assurance number of cycles in the screening test. For example, when the assurance number of cycles T is $1.0 \times 10^{12}$, the production device is subjected to a test consisting of only $1 \times 10^{10}$ cycles. If no defective memory cell has been detected in the cycling test consisting of $1 \times 10^{10}$ cycles, a prediction is made that no defective memory cell will likewise be detected if the device is subjected to $T=1.0 \times 10^{12}$ cycles of cycling test. This prediction is based on data obtained in the cycling tests consisting of $1.0 \times 10^{12}$ cycles that were conducted on non-production devices and TEG (wafers or chips carrying circuits or elements for evaluation which are produced when a new production process is developed and standardized or when a net circuit design is created). Thus, with the above-described screening test, a spread of assurance numbers of cycles T between the devices is not taken into account and all of the devices that passed the $1.0 \times 10^{10}$ cycling test are assumed to have an assurance number of cycles of $1.0 \times 10^{12}$.

For this reason, problems were associated with fatigue-related reliability of devices having an assurance number of cycles T determined by the above-described cycling test.

SUMMARY OF THE INVENTION

With the foregoing in view, it is an object of the present invention to provide a semiconductor memory device composed of ferroelectric memories which allows a cycling test consisting of the assurance number of cycles to be conducted on the entire device in the screening test.

In order to attain the above-described object, the semiconductor memory device of the present invention comprises a memory cell block composed of a memory cell unit having a plurality of memory cells each having a ferroelectric capacitor, and a test memory cell unit having a plurality of test memory cells. In accordance with the present invention, the layout pattern of the test memory cells is the same as the layout pattern of memory cells. Further, in accordance with the present invention, the test memory cell unit is arranged close to that memory cell of a plurality of memory cells which is arranged in a position in which the ferroelectric capacitor is easily degraded.

The test memory cell unit of the memory cell block of the semiconductor memory device in accordance with the present invention is used during a screening test in the course of reliability test. Further, because the layout pattern of test memory cells is the same as the layout pattern of memory cells, the test memory cell unit can be arranged in the desired position in the memory cell block during the screening test.

If the above-described cycling test is conducted in the screening test, fatigue is accumulated in the ferroelectric capacitors of memory cells. Therefore, that memory cell of a plurality of memory cells which is arranged in a position in which the ferroelectric capacitor is easily degraded has a high probability of being detected as a defective memory cell in the screening test. In accordance with the present invention, the test memory cell unit is arranged close to this memory cell. Further, if the semiconductor memory device in accordance with the present invention is subjected to a screening test by using the test memory cell unit, the cycling test can be conducted without causing the fatigue in the memory cells of the memory cell unit. Therefore, the reliability of the test can be greatly improved.

For example, when a cycling test with an assurance number of cycles of $1.0 \times 10^{12}$ is conducted on the above-described semiconductor memory device in accordance with the present invention, a cycling test consisting of $1.0 \times 10^{10}$ cycles, which is similar to the above-described conventional test, is conducted on the memory cell unit and test memory cell unit of the memory cell block. Then, a $99 \times 10^{10}$ cycling test is conducted only on the test memory cell unit. As a result, the test memory cell unit becomes subjected to a cycling test with an assurance number of cycles of $1.0 \times 10^{12}$. Thus, the semiconductor memory device in accordance with the present invention can be subjected to a cycling test with the assurance number of cycles, and reliability of the test can be greatly improved by comparison with that of the conventional cycling test.

BRIEF DESCRIPTION OF THE DRAWINGS

The foregoing and other objects, features and advantages of the present invention will be better understood from the following description taken in connection with the accompanying drawings, in which:

FIG. 6 illustrates the relationship between the discrimination sensitivity of a sense amplifier and the difference in bit line voltage, this relationship being used for explaining the operation of the second embodiment of the present invention;

DESCRIPTION OF THE PREFERRED EMBODIMENTS

The embodiments of the present invention will be described below with reference to the appended drawings which merely schematically illustrate the present invention, and the examples shown in the figures should not be construed as placing limitation on the present invention. Further, in the figures employed for the explanation of the present invention, identical structural components are assigned with identical symbols and the duplicate explanation thereof is omitted.

First Embodiment

The first embodiment of the present invention will be described below.

(1) Configuration of the First Embodiment

Figure 1:
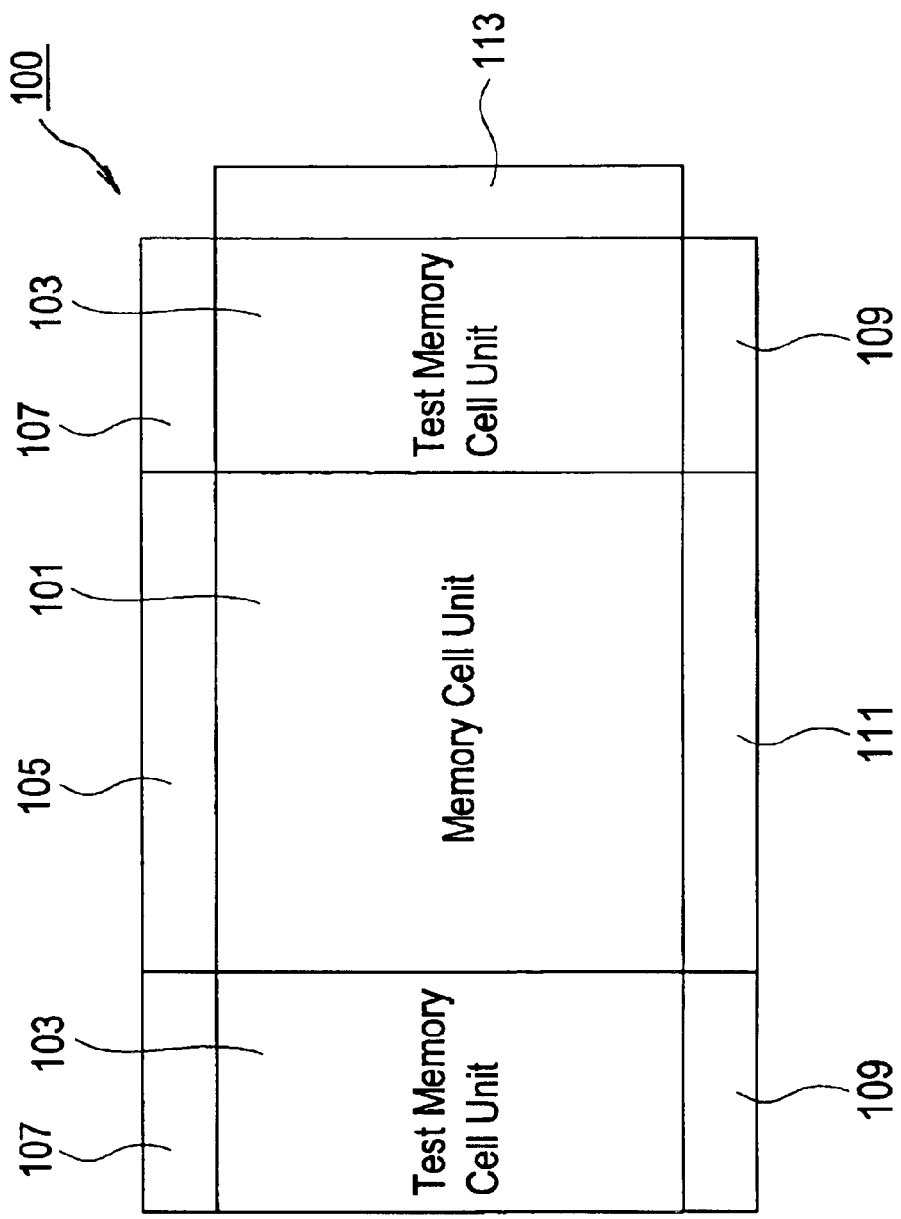
FIG. 1 illustrates the configuration of a memory cell block of the first embodiment of the present invention.

The configuration of the semiconductor memory device of the present embodiment will be described below. The semiconductor memory device of the present embodiment comprises a memory cell block. FIG. 1 illustrates the configuration of the memory cell block provided in the semiconductor memory device of the present embodiment.

The memory cell block 100 comprises a memory cell unit 101 and a test memory cell unit 103. The memory cell unit 101 has a plate line driver 105 and a word line driver 111, and the test memory cell unit 103 has a test plate line driver 107 and a test word line driver 109. Further, a sense amplifier 113 is externally connected to the memory cell block 100.

In the present embodiment, the memory cell unit 101 has a plurality of memory cells, and the test memory cell unit 103 has a plurality of test memory cells.

Figure 2:
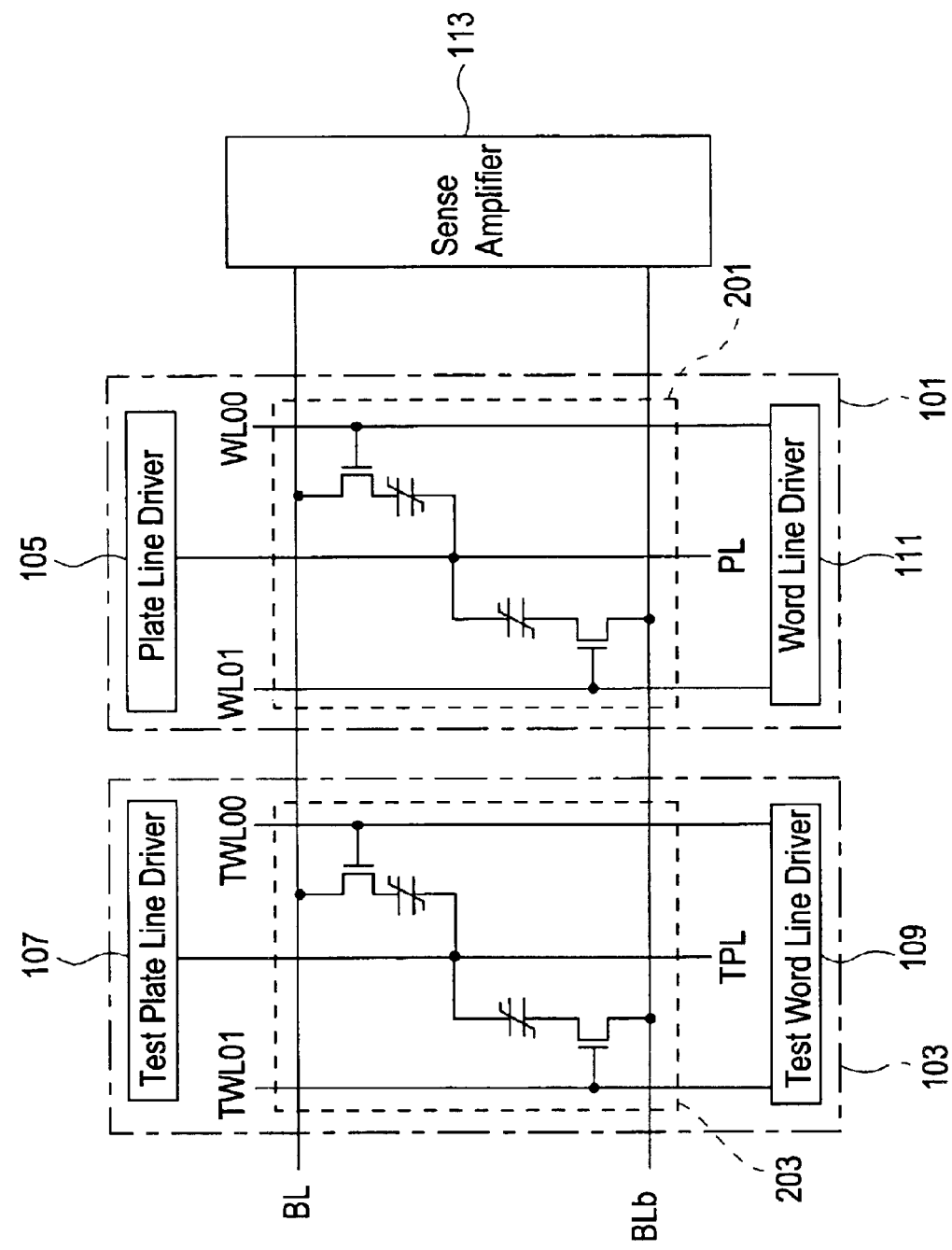
FIG. 2 illustrates the configuration of a memory cell and a test memory cell of the first embodiment of the present invention.

The configuration of the plurality of memory cells in the memory cell unit 101 and the plurality of test memory cells in the test memory cell unit 103 will be described below with reference to FIG. 2. FIG. 2 illustrates the configuration of a memory cell 201 which is one of the plurality of memory cells of memory cell unit 101, and a test memory cell 203 which is one of the plurality of memory cells of test memory cell unit 103. In the present embodiment, it is preferred that the memory cell unit 101 be composed of a plurality of memory cells with a configuration identical to that of memory cell 201, and that the test memory cell unit 103 be also composed of a plurality of test memory cells with a configuration identical to that of test memory cell 203.

Those multiple memory cells are arranged, as is generally known, as a matrix consisting of an appropriate number of columns and rows, and the multiple test memory cells are also arranged, as is generally known, as a matrix consisting of an appropriate number of columns and rows. The number of columns and rows of the memory cells may be selected appropriately according to the design.

Further, the test memory cell unit is provided adjacently to the memory cell unit. As shown in FIG. 1, in the present embodiment, the test memory cell unit is composed of the first and second test memory cell units and those first and second test memory cell units 103, 103 are arranged on both sides of the memory cell unit 101 in a row therewith.

First, the configuration of memory cell 201 will be explained. The memory cell 201 of the present embodiment has a ferroelectric capacitor. FIG. 2 shows the memory cell 201 with a 2T2C-type configuration identical to the configuration disclosed in Reference 1. In this configuration, the memory cell 201 is connected to the plate line driver 105 with a plate line PL, and to the word line driver 111 with a word line WL01 and a word line WL00. A plurality of memory cells constituting the memory cell unit 101 are connected, as described above, to the common plate line driver 105 with a plate line, and are connected, as described above, to the common word line driver 111 with a word line.

The configuration of the test memory cell 203 will be described below. In the present embodiment, the layout pattern of the test memory cell 203 is selected to be the same as the layout pattern of memory cell 201. Therefore, as shown in FIG. 2, when the memory cell 201 has a 2T2C-type configuration, the test memory cell 203 also has a 2T2C configuration identical to that of the memory cell 201. In this case, similarly to the memory cell 201, the test memory cell 203 is connected to a test plate line driver 107 with a test plate line TPL and connected to a test word line driver 109 with a test word line TWL01 and a test word line TWL00.

Further, as shown in FIG. 2, the memory cell 201 and test memory cell 203 are connected to a sense amplifier 113 with common bit lines BL and BLb.

Incidentally, the test memory cell unit 103 provided in the memory cell block 100 of the semiconductor memory device of the present embodiment is used during a screening test in reliability testing. As described above, the layout pattern of test memory cell 203 is identical to the layout pattern of memory cell 201. Therefore, during the screening test, the test memory cell 203 can be arranged in the desired position in the memory cell block 100. In the present embodiment, the test memory cell 203 is arranged close to that memory cell of a plurality of memory cells which is arranged in a position in which the ferroelectric capacitor can be easily degraded.

Here, the position in the memory cell unit 101 in which the ferroelectric capacitor can be easily degraded, for example, means the following position. In the integrated circuit configuration of memory cell block 100, the memory cell block 100 has a cover film for protecting the ferroelectric capacitor of memory cell 201 from damages induced by hydrogen and the like. However, in the memory cell unit 101, because of the structure of aforesaid cover film, hydrogen can easily penetrate along the periphery of the cover film. As a result, the ferroelectric capacitor can easily be degraded in the memory cells 201 arranged on the periphery of the above-mentioned cover film in the memory cell unit 101. Therefore, in this case, the position in the memory cell unit 101 in which the ferroelectric capacitor can be easily degraded means the periphery or peripheral area of the cover film of memory cell unit 101.

Figure 9A:
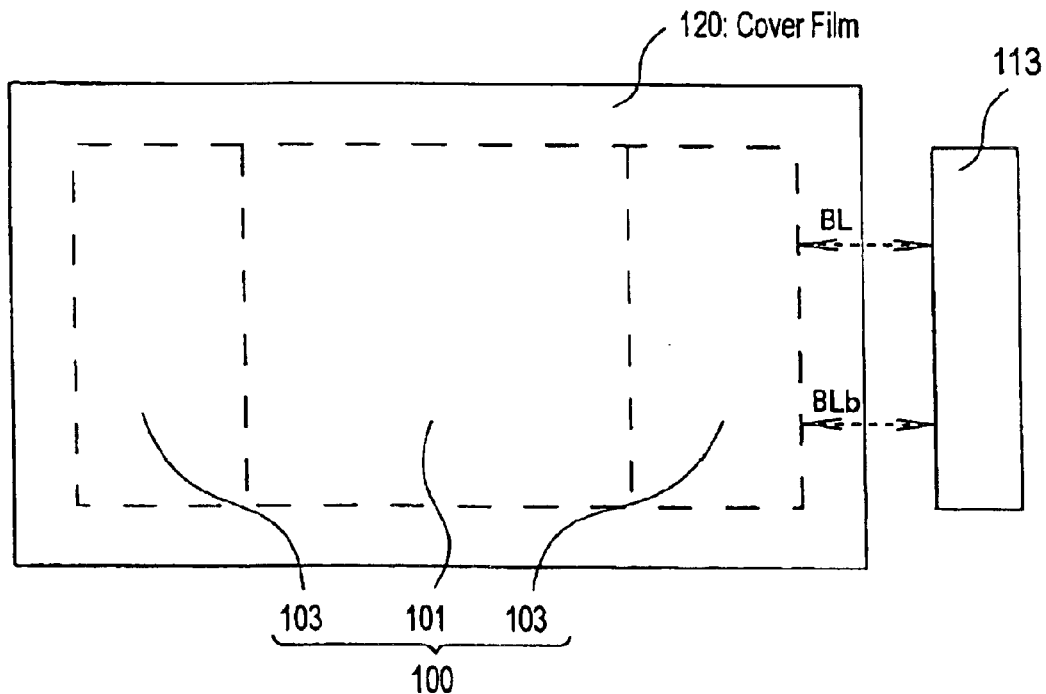
FIGS. 9(A) and 9(B) illustrate the mutual arrangement of the cover film and memory cell block, which is employed for explaining the present invention.

In accordance with the present invention, the cover film 120 as illustrated in FIG. 9(A) is provided so as to cover the first test memory cell unit 103, memory cell unit 101, and second test memory cell unit 103 in their entirety from above. The first and second test memory cell units 103, 103 are provided adjacently to the memory cells on both end sides of the memory cell unit and beneath the cover film 120.

(2) Operation of the First Embodiment

A screening test conducted with respect to the memory cell block 100 of the semiconductor memory device will be described below to explain the operation of the semiconductor memory device of the present embodiment.

In the screening test of the present embodiment, the above-described cycling test is conducted in an assurance number of cycles of $T=1.0\times10^{12}$. Further, it is assumed that the configuration of memory cell block 100 subjected to the screening test has two 16386-bit test memory cell units 103 and a 1 Mbit (=512 K×2) memory cell unit 101. Further, the semiconductor memory device is assumed to have a configuration provided with four above-described memory cell blocks 100. In this case, the configuration of semiconductor memory device has 4 Mbit (=1 Mbit×4) memory cells and 16386×2×4 bit test memory cells.

In the present embodiment, in the memory cell block 100, the test memory cell units 103 are arranged close to the memory cells arranged in the positions in which the ferroelectric capacitor can be easily degraded. As has already been explained, if a screening test is conducted, fatigue is accumulated in the ferroelectric capacitors of memory cells. Therefore, in the memory cell unit 101, of a plurality of memory cells, the memory cell arranged in the position in which the ferroelectric capacitor can be easily degraded, is a memory cell which can be detected with a high probability as a defective memory cell in the screening test.

Therefore, in the present embodiment, a cycling test is conducted by using the test memory cell units 103 and accumulation of fatigue in the memory cells of memory cell unit 101 is prevented. In the cycling test of the present embodiment, (a) similarly to the above-described conventional technology, the cycling test with $N_1=1.0\times10^{10}$ ($N_1$ is the number of cycles in the cycling test relating to the memory cell unit) cycles is conducted on the memory cell unit 101 and test memory cell units 103 of memory cell block 100;

(b) then, the cycling test with $N_2=99\times10^{10}$ ($N_2$ is the number of cycles in the cycling test relating to the test memory cell units) is conducted only on the test memory cell units 103. In case of this configuration example, $N_1<N_2$ and $N_1:N_2=1:99$. However, the $N_1$ and $N_2$ ratio is not limited to this ratio and can be set to any desired ratio according to the design.

It is arranged herein that if the cycling tests of (a) and (b) are conducted, the test memory cells 103 are subjected to a cycling test with $1.0\times10^{12}$ cycles which is an assurance number of cycles T ($T=N_1+N_2$). Further, in the present embodiment, it is presupposed that if no defective memory cells are detected when the cycling test identical to the conventional test has been conducted on the memory cell unit 101 of memory cell block 100 and also if no defective memory cells are detected when the cycling test of $1.0\times10^{12}$ cycles, which is the assurance number of cycles T, has been conducted on the test memory cell units 103, then no defective memory cells will be detected in the $1.0\times10^{12}$ cycling test of memory cell unit 101 of memory cell block 100. This presupposition is based on the data of $1.0\times10^{12}$ cycling test conducted on non-production devices or TEG, similarly to the above-described conventional technology.

However, as disclosed in the Published Reference Material 1, a large time is predictably required to conduct a cycling test with an assurance number of cycles $T=1.0\times10^{12}$ on the above-described semiconductor memory device and such a test is difficult to implement. For this reason, as described in Published Reference Material 1, in the cycling test there are conducted a voltage accelerated test in which a voltage applied to the memory cell block 100 is increased and a simultaneous measurement test in which a fatigue stress is once applied to multiple memory cells. Therefore, in the cycling test of the present embodiment, too, the cycling test can be executed within a short time if the voltage accelerated test and simultaneous measurement test are used together.

According to Published Reference Material 1, in the voltage accelerated test, if the voltage applied to the memory cell block 100 is increased by 1 V, the time required for the cycling test can be reduced by a factor of 10. In the present embodiment, in the above-described case (a), the voltage during cycling test is increased by 2 V. At this time, the cycling test corresponding to $1.0\times10^{10}$ cycles can be conducted in $1.0\times10^{8}$ cycles. Further, in the above-described case (b), the cycling test is conducted by further increasing the voltage by 2 V after (a). At this time, the cycling test corresponding to $99\times10^{10}$ cycles can be conducted in $99\times10^{6}$ cycles.

Further, in the present embodiment, the above-mentioned simultaneous measurement test is conduced on the memory cell block 100, which was explained with reference to FIGS. 1 and 2, in a batch operation mode in which all of the memory cells of memory cell unit 101 and all of the test memory cells of test memory cell units 103 in the above-mentioned (a) case and all of the test memory cells of test memory cell units 103 in the above-mentioned (b) case are activated together in a single-cycle cycling test. The operation cycle time in the (a) and (b) cases is 120 $\mu$sec and 12 $\mu$sec, respectively.

The operation cycle time as referred to hereinabove means the time required to conduct a single-cycle cycling test on all of the memory cells and test memory cells constituting memory cell block 100 in the case of (a), and on all of the test memory cells of test memory cell units 103 in the case of (b).

Therefore, the time required for the cycling test in the (a) case will be $(120\ (\mu\text{sec})\times1\times10^{8}\ (\text{cycles}))/(60\times60\ (\text{sec/h}))=3.33$ (h) and the time required for the cycling test in the (b) case will be $(12\ (\mu\text{sec})\times1\times99\times10^{6}\ (\text{cycles}))/(60\times60\ (\text{sec/h}))=0.33$ (h), where sec and h stand for seconds and hours, respectively. As a result, in the semiconductor memory device of the present embodiment, using the test memory cell units 103 makes it possible to conduct a cycling test with an assurance number of cycles $T=1.0\times10^{12}$ within $3.33+0.33=3.66$ h.

As described above, the semiconductor memory device of the present embodiment can be subjected to a cycling test with the assurance number of cycles T, without causing any fatigue of memory cells in the memory cell unit 101. Further, in the present embodiment, the test memory cell units 103 are arranged in positions in the memory cell block 100, in which the ferroelectric capacitors are easily degraded. The fatigue evaluation is conducted based on the results of a cycling test of test memory cell units 103, this cycling test being identical to the cycling test with the assurance number of cycles T. Therefore, the reliability of screening test can be greatly improved by comparison with the above-described conventional technology. Furthermore, if the voltage accelerated test and simultaneous measurement test are conducted together during the cycling test, as in the above-described conventional procedure, the test can be executed within a short time.

The above-described screening test is merely an example. In the present embodiment, the cycling test can be conducted with the desired assurance number of cycles, and the procedures of the voltage accelerated test and simultaneous measurement test are not limited to the above-described procedures. Further, the configuration of memory cell block 100 and semiconductor memory device is a matter of design that can be determined by those skilled in the art and is not limited to the above-described configuration.

Moreover, in the above-described embodiment, the screening test was explained with respect to the case in which a cycling test was executed. However, the semiconductor memory device of the present embodiment also may be subjected to an imprint test or retention test. In this case, the above-mentioned tests can be executed without accumulating excess fatigue in memory cells of memory cell unit 101 by using the test memory cell units 103 similarly to the above-described cycling test.

Second Embodiment

The second embodiment of the present invention will be described below.

(3) Configuration of the Second Embodiment

Figure 3:
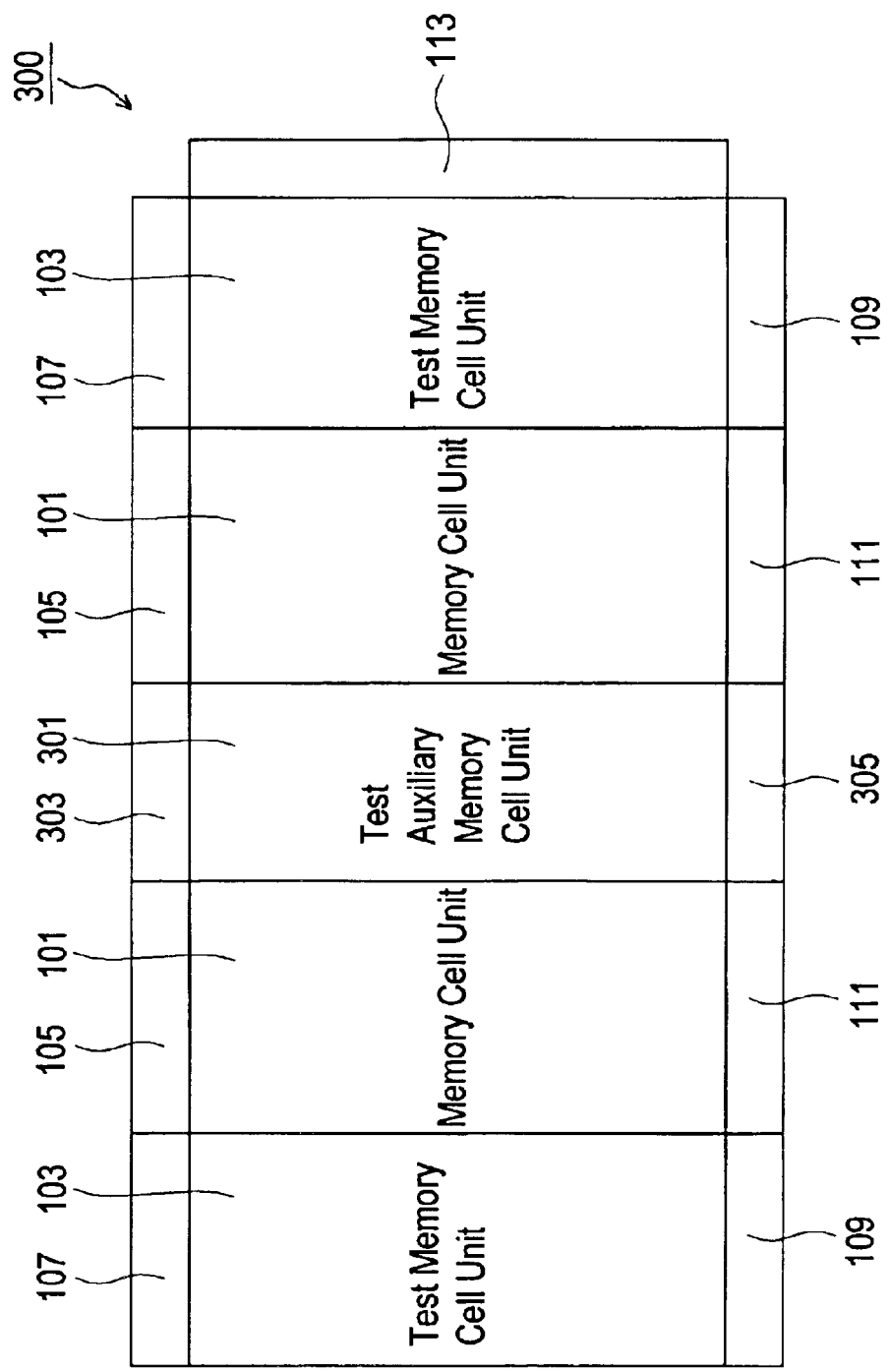
FIG. 3 illustrates the configuration of a memory cell block of the second embodiment of the present invention.

The configuration of the semiconductor memory device of the present embodiment is identical to that of the above-described first embodiment. FIG. 3 shows the configuration of a memory cell block 300 of the present embodiment. The portion of the configuration of the memory cell block 300 which is identical to that of the first embodiment illustrated by FIG. 1 and FIG. 2 is assigned in FIG. 3 with the same symbols as shown in FIG. 1 and FIG. 2, and the duplicate explanation thereof is omitted.

As shown in FIG. 3, the memory cell block 300 of the present embodiment has a configuration obtained by providing the memory cell block 100 of the first embodiment shown in FIG. 1 with a plurality of test auxiliary memory cell units 301. FIG. 3 shows the configuration in which one test auxiliary memory cell unit 301 is provided in the memory cell block 300. Furthermore, the test auxiliary memory cell unit 301 comprises a test auxiliary plate line driver 303 and a test auxiliary word line driver 305.

In the present embodiment, as shown in FIG. 3, the memory cell unit is divided into two portions, the first and second memory cell units 101, 101, and a test auxiliary memory cell unit is provided therebetween in a row with the memory cell units.

Figure 9B:
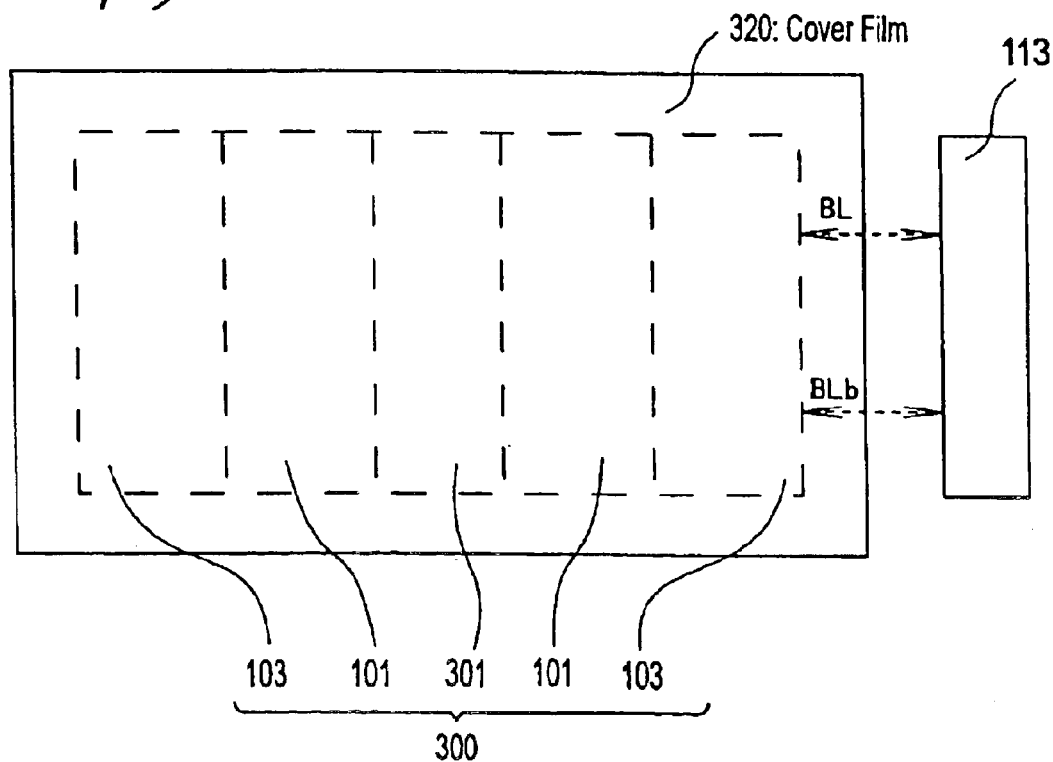

In accordance with the present invention, as shown in FIG. 9(B), a cover film 320 is provided to cover the first test memory cell unit 103, first memory cell unit 101, test auxiliary memory cell unit 301, second memory cell unit 101, and second test memory cell unit 103 in their entirety from above. The first and second test memory cell units 103, 103 and test auxiliary memory cell unit 301 are provided adjacently to memory cells on both end sides of the first and second memory cell units 101, 101.

The test auxiliary memory cell unit 301 has a plurality of test auxiliary memory cells arranged in a matrix consisting of an appropriate number of columns and rows.

Figure 4:
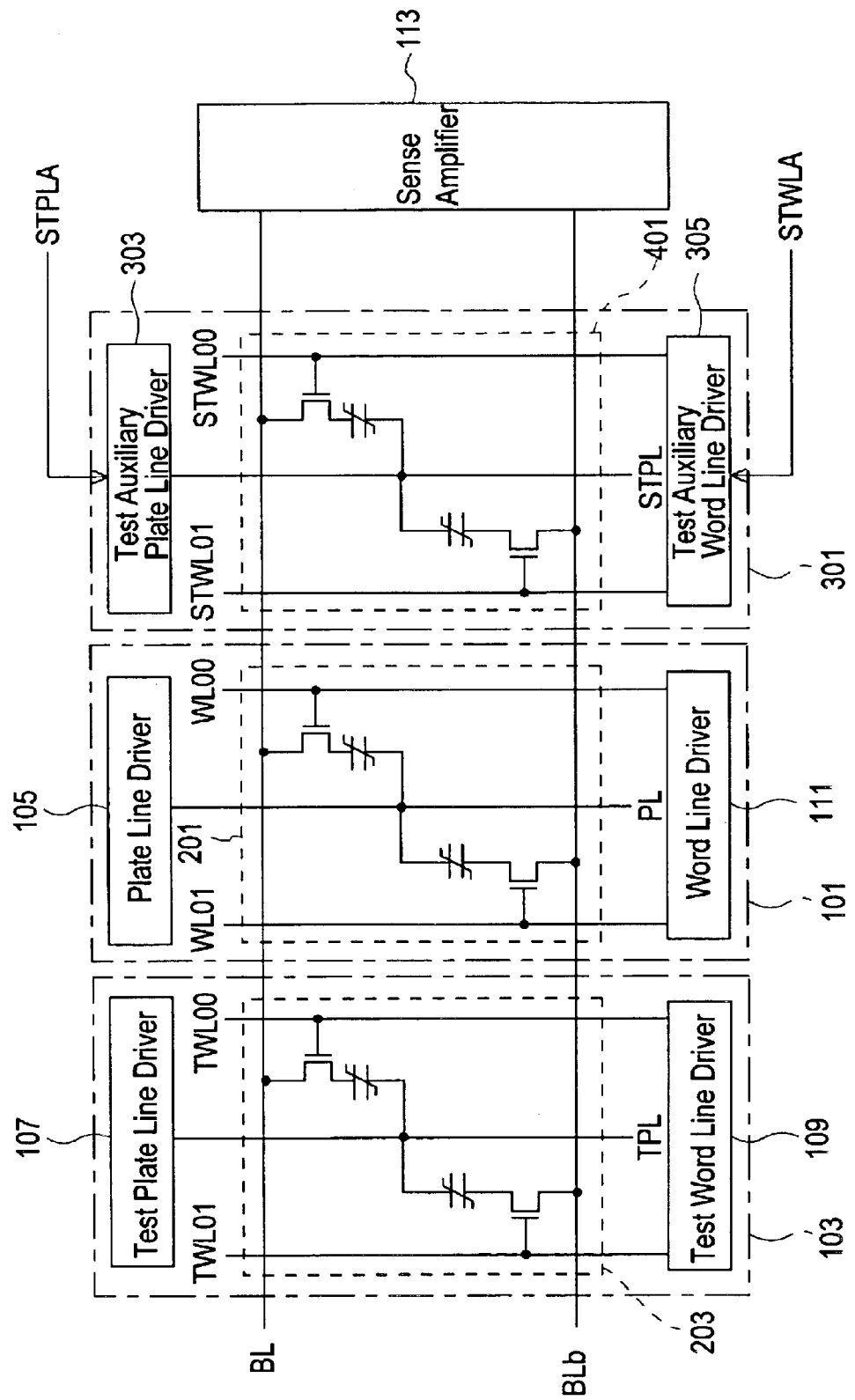
FIG. 4 illustrates the configuration of a test auxiliary memory cell of the second embodiment of the present invention.

The configuration of a test auxiliary memory cell will be explained below with reference to FIG. 4. FIG. 4 illustrates the configuration of a test auxiliary memory cell 401 of a plurality of test auxiliary memory cells of test auxiliary memory cell unit 301. In this embodiment, it is preferred that the test auxiliary memory cell unit 301 be composed of a plurality of test auxiliary memory cells having a configuration identical to that of the below-described test auxiliary memory cell 401. Moreover, in the configuration shown in FIG. 4, the portion of the configuration identical to that shown in FIG. 2 is assigned with the same symbols as in FIG. 2, and the duplicate explanation thereof is omitted.

In the present embodiment the layout pattern of test auxiliary memory cell 401 is considered to be identical to the layout pattern of memory cell 201. In FIG. 4, a memory cell 201 is shown which has a 2T2C-type configuration identical to that shown in FIG. 2. Therefore, in this case, the test auxiliary memory cell 401 also has a 2T2C-type configuration identical to that of memory cell 201. In this case, the test auxiliary memory cell 401, similarly to memory cell 201, is connected to the test auxiliary plate line driver 303 with a test auxiliary plate line STPL, and connected to a test auxiliary word line driver 305 with a test auxiliary word line STWL01 and a test auxiliary word line STWL00.

Further, as shown in FIG. 4, the memory cell 201 and test auxiliary memory cell 401 are connected to a sense amplifier 113 with common bit lines BL and BLb.

Further, in the present embodiment, the test auxiliary memory cell unit 301 with the above-described configuration is preferably used during screening test in the reliability test, similarly to the test memory cell unit 103.

(4) Operation of the Second Embodiment.

The operation of the semiconductor memory device of the present embodiment will be described below. As was mentioned above, the test auxiliary memory cell unit 301 is used during a screening test. During a screening test, an activation signal is input in the test auxiliary memory cell unit 301, and inputting this signal activates the test auxiliary memory cell unit 301. The operation of test auxiliary memory cell 401 relating to the activation of test auxiliary memory cell unit 301 will be explained with reference to FIG. 4. The operation of a plurality of test auxiliary memory cells of the test auxiliary memory cell unit 301 is the same as the operation of test auxiliary memory cell 401 that will be explained below.

In this embodiment, as shown in FIG. 4, the above-mentioned activation signal preferably comprises a first activation signal STWLA input in the test auxiliary word line driver 305 and a second activation signal STPLA input in the test auxiliary plate line driver 303. In the configuration shown in FIG. 4, if the first activation signal STWLA is input in the test auxiliary word line driver 305, then the test auxiliary word line driver 305 fixes the test auxiliary work lines STWL00 and STWL01 at "H". Further, if the second activation signal STPLA is input in the test auxiliary plate line driver 303, then the test auxiliary plate line driver 303 fixes the test auxiliary plate line STPL at "L". In this state, the electric charge from the test auxiliary memory cell 401 flows out into the bit lines BL and BLb.

In comparison with the configuration shown in FIG. 2, in the configuration of the present embodiment shown in FIG. 4, the test auxiliary memory cell 401 is additionally connected to the sense amplifier 113 with bit lines BL and BLb which are common with the memory cell 201 and test memory cell 203. As described above, if the test auxiliary memory cell unit 301 is activated with the first and second activation signals STWLA and STPLA, the bit line capacity of bit lines BL and BLb is increases from the bit line capacity Cb0 of the first embodiment to the bit line capacity Cb1.

Figure 5A:
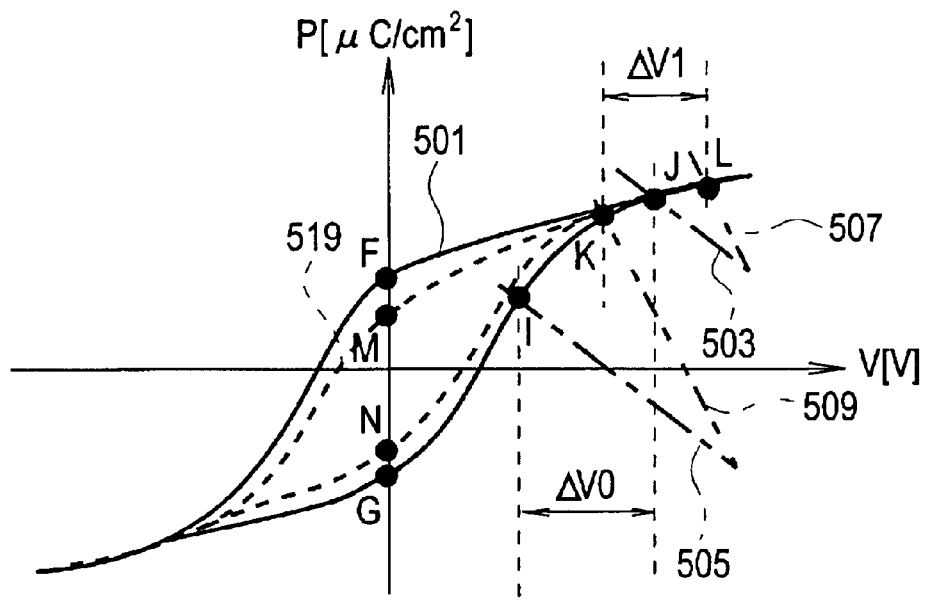
FIG. 5(A) shows a hysteresis curve representing a polarization state of a memory cell and employed for explaining the operation of the second embodiment of the present invention.
Figure 5B:
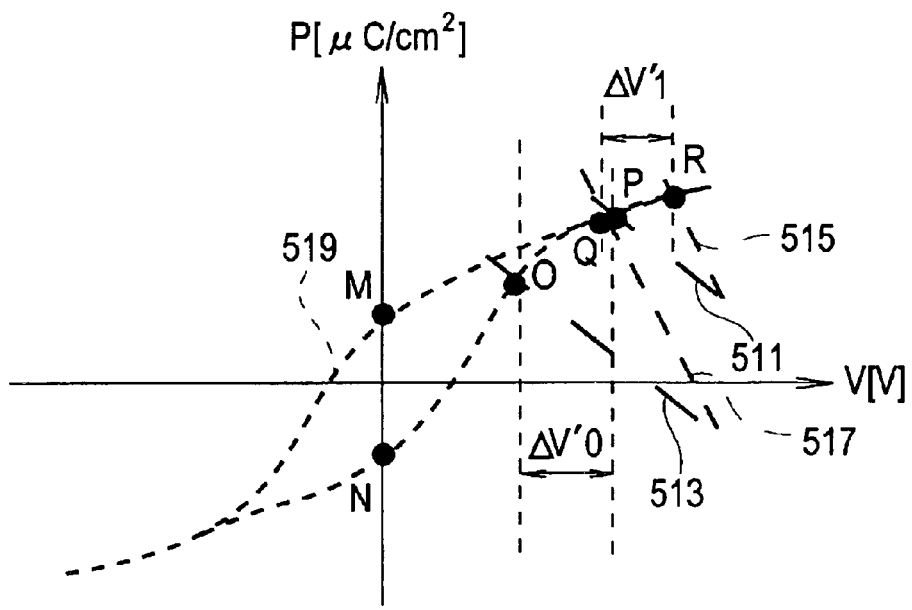
FIG. 5(B) shows a hysteresis curve representing a polarization state of a degraded memory cell.
Figure 8:
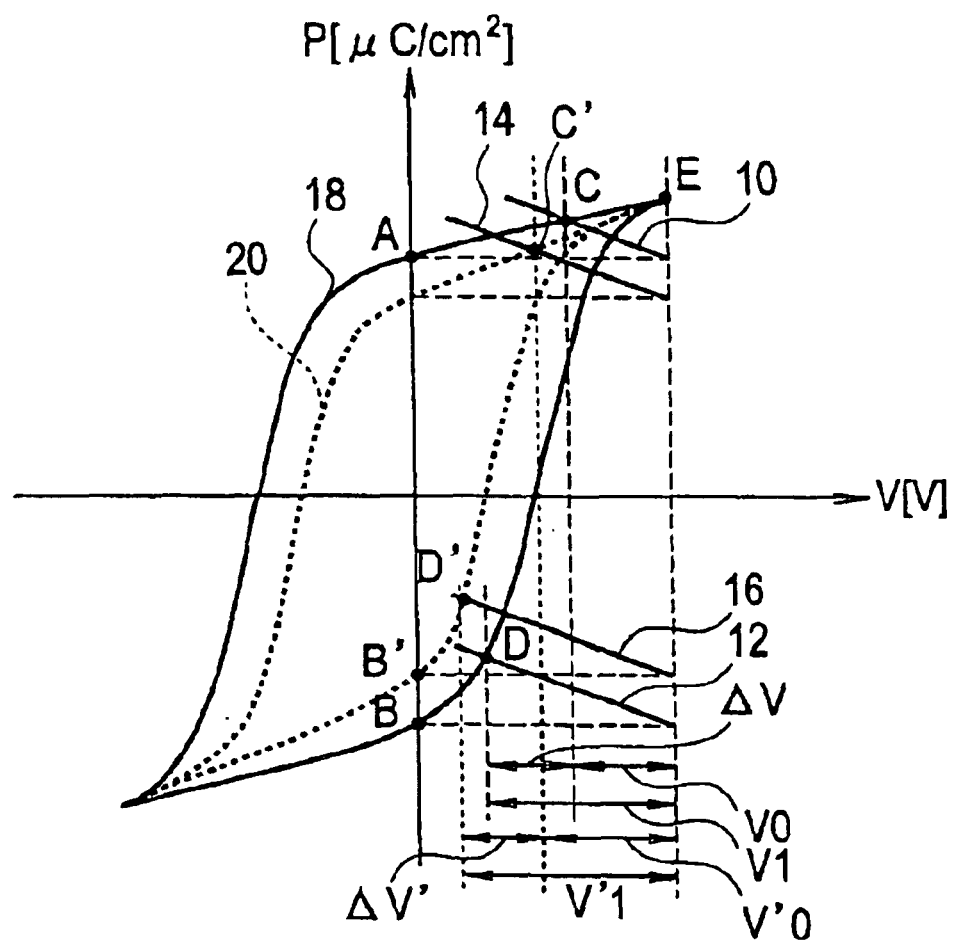
FIG. 8 illustrates the conventional technology.

Here, FIG. 5(A) shows a hysteresis curve 501 representing the polarization state of ferroelectric capacitor of memory cell 201 of memory cell unit 101, similarly to FIG. 8. In FIGS. 5(A) and 5(B), the hysteresis curve 519 of the ferroelectric capacitor of memory cell 201, which degraded as a result of fatigue stress in the screening test, is represented by a dot line, similarly to FIG. 8. Therefore, in FIGS. 5(A) and 5(B), polarization P ($\mu C/cm^2$) is plotted against the ordinate, and voltage V (V) is plotted against the abscissa.

The ferroelectric capacitor of memory cell 201 has two residual polarization states represented by F point and G point in FIG. 5(A). In the hysteresis curve 501 of FIG. 5(A), there are shown the first to fourth load lines 503, 505, 507, 509 corresponding to the two residual polarization states represented by F point and G point. Here, the first and second load lines 503 and 505 correspond to the two residual polarization states of memory cell 201 in the configuration of the first embodiment, and the third and fourth load lines 507 and 509 correspond to the two residual polarization states of memory cell 201 in the configuration of the present embodiment. Therefore, the slope of the first and second load lines 503 and 505 gives the bit line capacity Cb0, and the slope of the third and fourth load lines 507 and 509 gives the bit line capacity Cb1.

Further, the two residual polarization states of the ferroelectric capacitor of degraded memory cell 201 are shown by M point and N point in FIGS. 5(A) and 5(B). Similarly to the hysteresis curve 501 of FIG. 5(A), in the hysteresis curve 519 of FIG. 5(B), there are shown fifth—eighth load lines 511, 513, 515, 517 corresponding to the two residual polarization states represented by M point and N point. Here, the fifth and sixth load lines 511 and 513 correspond to the two residual polarization states of degraded memory cell 201 in the configuration of the first embodiment, and the seventh and eighth load lines 515 and 517 correspond to the two residual polarization states of degraded memory cell 201 in the configuration of the present embodiment. Therefore, the slope of the fifth and sixth load lines 511 and 513 gives the bit line capacity Cb0, and the slope of the seventh and eighth load lines 515 and 517 gives the bit line capacity Cb1.

As described above, in the cycling test, the sense amplifier 113 detects a bit line voltage produced by voltage division among the ferroelectric capacitors of memory cell 201, test memory cell 203, or test auxiliary memory cell 401 and bit lines BL and BLb. Further, the bit line voltage in two memory states of ferroelectric capacitor of memory cell 201 are found by a procedure identical to that explained with reference to FIG. 8.

Referring to FIG. 5(A), if a procedure explained with reference to FIG. 8 is executed with respect to the first embodiment, the difference $\Delta V0$ in bit line voltage between the two memory states of the ferroelectric capacitor of memory cell 201 is equal to the difference between the voltage corresponding to intersection point J of the first load line 503 and hysteresis curve 501 and the voltage corresponding to intersection point I of the second load line 505 and hysteresis curve 501. Furthermore, in the present embodiment, the difference $\Delta V1$ in bit line voltage between the two memory states of the ferroelectric capacitor of memory cell 201 can be found from intersection point L of the third load line 507 and hysteresis curve 501 and intersection point K of the fourth load line 509 and hysteresis curve 501, similarly to the above-described ΔV0. In the present embodiment, as described above, if the bit line capacity Cb0 of the first embodiment increases to bit line capacity Cb1, the difference ΔV in bit line voltage, as follows from FIG. 5(A), decreases from the difference ΔV0 in bit line voltage of the first embodiment to the difference ΔV1 in bit line voltage.

Further, referring to FIG. 5(B), the difference ΔV'0 in bit line voltage between the two memory states of the ferroelectric capacitor of memory cell 201 of the first embodiment can be found for the degraded memory cell 201 from intersection point P of the fifth load line 511 and hysteresis curve 519 and intersection point O of the sixth load line 513 and hysteresis curve 519 by the procedure identical to that explained with reference to FIG. 5(A). Moreover, for the degraded memory cell 201 shown in the same figure, the difference ΔV'1 in bit line voltage between the two memory states of the ferroelectric capacitor of the memory cell 201 of the first embodiment can be also found by the procedure identical to that explained with reference to FIG. 5(A) from intersection point R of the seventh load line 515 and hysteresis curve 519 and intersection point Q of the eighth load line 517 and hysteresis curve 519. In the present embodiment, as described above, if the bit line capacity Cb0 of the first embodiment increases to bit line capacity Cb1, the difference ΔV in bit line voltage relating to the degraded memory cell 201 decreases, as shown in FIG. 5(B), from the difference ΔV' in bit line voltage of the first embodiment to the difference ΔV'1 in bit line voltage.

The relationship between the difference ΔV in bit line voltage between the two memory states of the ferroelectric capacitor of memory cell 201 and the discrimination sensitivity of sense amplifier 113 will be explained with reference to FIG. 6 with respect to the cycling test in the screening test. In FIG. 6, the number of test cycles in the cycling test is plotted against the abscissa and the difference ΔV (V) in bit line voltage between the two memory states of the ferroelectric capacitor of memory cell 201 is plotted against the ordinate. This figure is employed for explaining the operation. Further, FIG. 6 shows the first characteristic 601 and second characteristic 603 of bit lines BL and BLb of the first embodiment and the third characteristic 605 and fourth characteristic 607 of bit lines BL and BLb in the present embodiment. Furthermore, the discrimination sensitivity of sense amplifier 113 in the first—fourth characteristics 601, 603, 605, 607 mentioned in reference to FIG. 6 is 0.1 V.

Referring to the first embodiment, the first characteristic 601 represents changes of the difference ΔV0 in bit line voltage in the cycling test when the difference ΔV0 in bit line voltage relating to the memory cell 201 is 0.5 V. Further, the second characteristic 603 represents changes of the difference ΔV'0 in bit line voltage in the cycling test when the difference ΔV'0 in bit line voltage relating to the degraded memory cell 201 is 0.4 V. According to the first characteristic 601 and second characteristic 603 shown in FIG. 6, in order to detect the degraded memory cell 201 in the screening test, it is necessary to conduct a cycling test consisting of $1.0 \times 10^{10}$ cycles in which the difference ΔV'0 in bit line voltage relating to the degraded memory cell 201 becomes no more than the discrimination sensitivity 0.1 V of sense amplifier 113. Here, the discrimination sensitivity is shown in voltage unit.

On the other hand, in the present embodiment, the third characteristic 605 represents changes of the difference ΔV1 in bit line voltage in the cycling test when the difference ΔV1 in bit line voltage relating to the memory cell 201 is 0.3 V. Further, the fourth characteristic 607 represents changes of the difference ΔV'1 in bit line voltage in the cycling test when the difference ΔV'1 in bit line voltage relating to the degraded memory cell 201 is 0.2 V. According to the third characteristic 605 and fourth characteristic 607 shown in FIG. 6, in the present embodiment, the sufficient number of test cycles in the cycling test conducted to detect the degraded memory cell 201 is $1.0 \times 10^8$ at which number the difference ΔV'1 in bit line voltage relating to the degraded memory cell 201 becomes no more than the discrimination sensitivity 0.1 V of sense amplifier 113.

Therefore, in the present embodiment, as follows from FIGS. 5(A) and (B) and FIG. 6, the cycling test with the assurance number of cycles identical to that of the first embodiment can be conducted in fewer cycles than in the above-described first embodiment.

An example of conducting the screening test identical to that of the first embodiment, which was explained in section (2) hereinabove, on the memory cell block 300 of the semiconductor memory device of the present embodiment will be described below. A cycling test in the screening test of the present embodiment is assumed to be conducted by the same procedure and under the same conditions as described in section (2). Therefore, the explanation of the cycling test of the present embodiment which duplicates that of section (2) will be omitted.

The memory cell block 300 subjected to the screening test of the present embodiment is assumed to have a configuration identical to that of the memory cell block 100, this configuration further comprising a 16386-bit test auxiliary memory cell unit 301. In this case, the semiconductor memory device has a structure comprising 4 Mbit (=1 Mbit×4) memory cells, 16386×2×4 bit test memory cells, and 16386×4 bit test auxiliary memory cells.

Further, in the screening test of the below-described embodiment, as has been described with reference to FIG. 6, the difference ΔV1 in bit line voltage relating to the memory cell 201 is taken to be 0.3 V and the difference ΔV'1 in bit line voltage relating to the degraded memory cell 201 is taken to be 0.2 V. Further, in the first embodiment compared with the present embodiment, the difference ΔV0 in bit line voltage relating to the memory cell 201 is taken to be 0.5 V and the difference ΔV' in bit line voltage relating to the degraded memory cell 201 is taken to be 0.4 V. Under those conditions, as described above, the present embodiment makes it possible to accelerate the cycling test of the first embodiment by a factor of $10^2$. Therefore, the cycling test with the assurance number of cycles equal to that of the first embodiment can be conducted in fewer cycles than the test of the first embodiment.

As a result, in the present embodiment, the cycling test identical to the $1.0 \times 10^8$ cycling test conducted in the (a) procedure in the above-described first embodiment can be conducted in $1.0 \times 10^6$ cycles, that is, in fewer cycles. Furthermore, in the present embodiment, the cycling test identical to the $99 \times 10^6$ cycling test conducted in the (b) procedure in the above-described first embodiment can be conducted in $99 \times 10^4$ cycles, that is, in fewer cycles.

Therefore, in the present embodiment, the test identical to the cycling test in the (a) procedure in the above-described first embodiment can be conducted within $(120\ (\mu sec) \times 1 \times 10^6\ (cycles))/(60 \times 60\ (sec/h)) = 0.033$ (h) and the test identical to the cycling test in the (b) procedure can be conducted within $(12\ (\mu sec) \times 1 \times 99 \times 10^4\ (cycles))/(60 \times 60\ (sec/h))$ 0.003 (h). As a result, in the semiconductor memory device of the present embodiment, the cycling test with an assurance number of cycles $T=1.0\times10^{12}$ can be conducted within a time of 0.033+0.003=0.036 h, which is less that in the first embodiment.

As described above, the semiconductor memory device of the present embodiment has a configuration and operates in a manner identical to those of the first embodiment. Therefore, the effect obtained is identical to that of the first embodiment. Further, by contrast with the first embodiment, a test auxiliary memory cell unit 301 is additionally arranged in the semiconductor memory device of the present embodiment. For this reason, the bit line capacity during screening test is increased. As a result, the difference ΔV in bit line voltage relating to the memory cell in the degraded memory cell unit 101 that can be detected with the sense amplifier 113 is reduced. As a consequence, the cycling test identical to that of the first embodiment can be conducted in fewer cycles than the test of the first embodiment. Therefore, in the present embodiment the cycling test can be executed within a shorter time than in the first embodiment.

The above-described screening test is merely an example. In the present embodiment, the cycling test can be conducted with the desired assurance number of cycles, and the procedures of the voltage accelerated test and simultaneous measurement test are not limited to the above-described procedures. Further, the configuration of memory cell block 300 and semiconductor memory device is a matter of design that can be determined by those skilled in the art and is not limited to the above-described configuration.

For example, FIG. 3 shows a configuration in which one test auxiliary memory cell unit 301 is provided in the memory cell block 300, and the semiconductor memory device having such a configuration has been explained in sections (3) and (4). However, as has already been mentioned above, a plurality of test auxiliary memory cell units 301 can be provided in the memory cell block 300. Further, a bit line capacity during screening test can be increased to a desired capacity by inputting the above-described activation signal in any number of test auxiliary memory cell units 301 of a plurality test auxiliary memory cell units 301.

Third Embodiment

Figure 7:
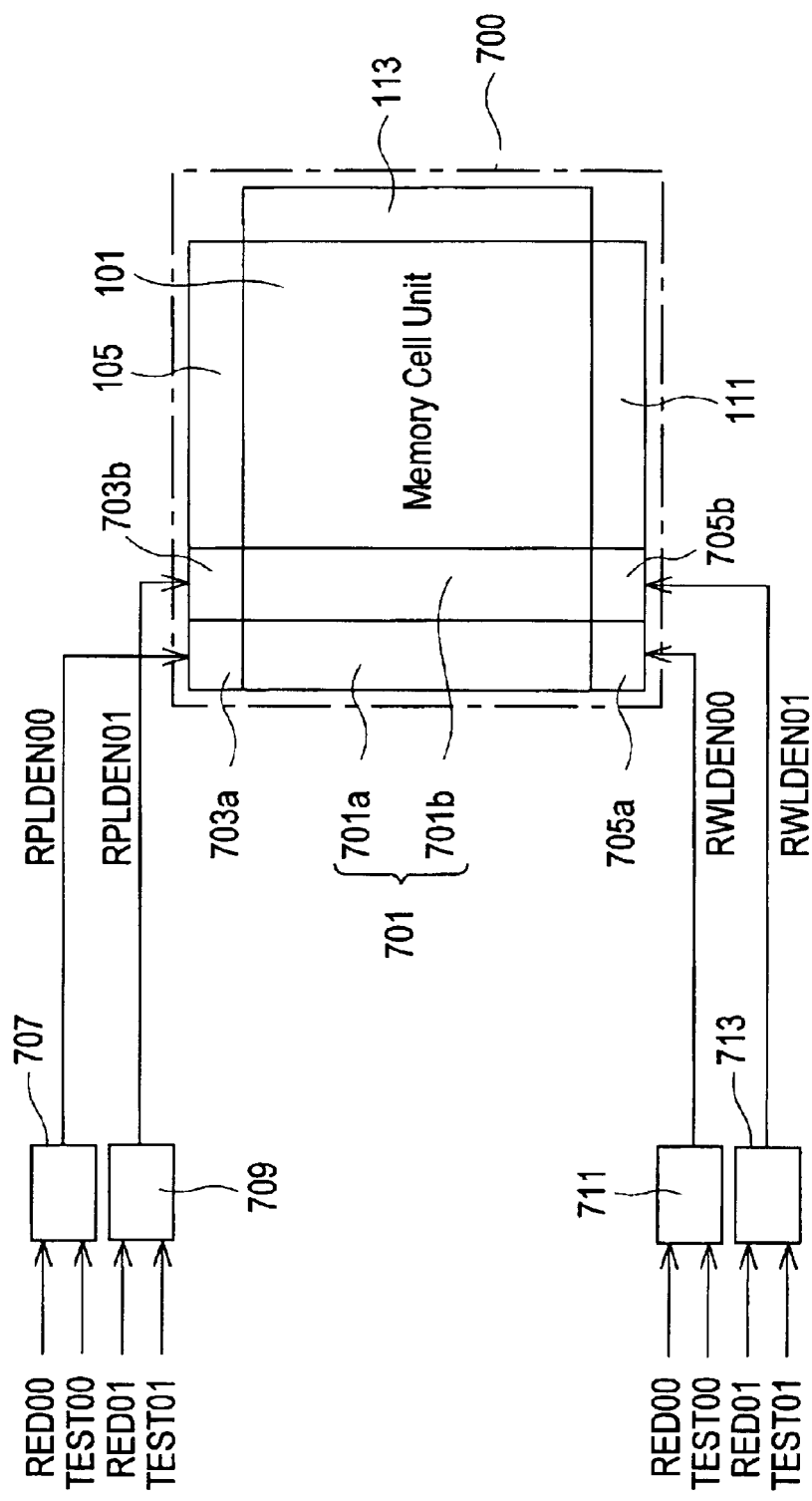
FIG. 7 illustrates a configuration of a memory cell block of the third embodiment of the present invention.

The third embodiment of the present invention will be described below. The configuration of the semiconductor memory device of the present embodiment is identical to that of the above-described first and second embodiments. FIG. 7 illustrates the configuration of a memory cell block 700 of the present embodiment. The configuration of the memory cell block 70, which is identical to the configuration of the first embodiment shown in FIG. 1 or FIG. 2 and the configuration of the second embodiment shown in FIG. 3 or FIG. 4 is assigned in FIG. 7 with the symbols identical to those in the above-mentioned figures and the duplicate explanation thereof is omitted.

The memory cell block 700 has a redundancy memory cell unit 701. The redundancy memory cell unit 701 is generally a reserve circuit of memory cell block 700. The redundancy memory cell unit 701 has a plurality of redundancy memory cells which are not shown in FIG. 7. As well known in prior art technology, a defected memory cell of a plurality of memory cells of memory cell unit 101 is replaced with a redundancy memory cell of redundancy memory cell unit 701.

In the present embodiment, the test memory cell 203 explained with reference to FIG. 2 and FIG. 4 or the test auxiliary memory cell 401 explained with reference to FIG. 4 is used as the redundancy memory cell. In this case, the test memory cell unit 103 explained with reference to FIG. 1 and FIG. 3 or the test auxiliary memory cell unit 301 explained with reference to FIG. 3 is configured as a redundancy memory cell unit 701. Thus, in the present embodiment, when the redundancy memory cell unit 701 is used as the test memory cell unit 103 or test auxiliary memory cell unit 301, the redundancy memory cell unit 701 is preferably used during screening test in the reliability test. However, when the redundancy memory cell unit 701 has been used in advance as the above-mentioned reserved circuit during the screening test, it cannot be further used as the test memory cell unit 103 or test auxiliary memory cell unit 301.

The operation of redundancy memory cell unit 701 during screening test will be explained below. FIG. 7 shows the redundancy memory cell unit 701 composed of a first redundancy memory cell unit 701a and a second redundancy memory cell unit 701b. The configuration of the second redundancy memory cell unit 701b is identical to that of the first redundancy memory cell unit 701a. However, in the below-described present embodiment, the first redundancy memory cell unit 701a is used as the above-mentioned reserve circuit, and the second redundancy memory cell unit 701b is used as the test memory cell unit 103 or test auxiliary memory cell unit 301.

The first redundancy memory cell unit 701a has a first redundancy plate line driver 703a and a first word line driver 705a. Further, as is the case with the first redundancy memory cell unit 701a, the second redundancy memory cell unit 701b has a second redundancy plate line driver 703b and a second word line driver 705b.

Further, it is preferred that a configuration be used in which a first redundancy plate line driver control circuit 707 and second redundancy plate line driver control circuit 709 and a first redundancy word line driver control circuit 711 and second redundancy word line driver control circuit 713 be provided outside the memory cell block 700.

When the first redundancy memory cell unit 701a is used as the above-mentioned reserved circuit during the screening test, a first redundancy signal RED00 and a non-activating test signal TEST00 are input in the first redundancy plate line driver control circuit 707 and first redundancy word line driver control circuit 711. If those signals are input, a first redundancy plate line driver enable signal RPLDEN00 is output from the first redundancy plate line driver control circuit 707 and a first redundancy word line driver enable signal RWLDEN00 is output from the first redundancy word line driver control circuit 711. If the first redundancy plate line driver enable signal RPLDEN00 is input from the first redundancy plate line driver control circuit 707 into the first redundancy plate line driver 703a, and the first redundancy word line driver enable signal RWLDEN00 is input from the first redundancy word line driver control circuit 711 into the first redundancy word line driver 705a in the first redundancy memory cell unit 701a, then the first redundancy memory cell unit 701a is activated. If the first redundancy memory cell unit 701a is activated, it operates as the above-mentioned reserved circuit.

Further, a second redundancy signal RED01 and an activating test signal TEST01 are input in the second redundancy plate line driver control circuit 709 and second redundancy word line driver control circuit 713. If those signals are input, a second redundancy plate line driver enable signal RPLDEN01 is output from the second redundancy plate line driver control circuit 709 and a second redundancy word line driver enable signal RWLDEN01 is output from the second redundancy word line driver control circuit 713. Further, if the second redundancy plate line driver enable signal RPLDEN01 is input from the second redundancy plate line driver control circuit 709 into the second redundancy plate line driver 703b, and the second redundancy word line driver enable signal RWLDEN01 is input from the second redundancy word line driver control circuit 713 into the second redundancy word line driver 705b in the second redundancy memory cell unit 701b, then the second redundancy memory cell unit 701b is activated. If the second redundancy memory cell unit 701b is activated, it operates as the test memory cell unit 103 or test auxiliary memory cell unit 301 in the first or second embodiment.

As described above, in the present embodiment, the redundancy memory cell unit 701 serving as a reserved circuit provided in the memory cell block 700 is usually used as the test memory cell unit 103 or test auxiliary memory cell unit 301 explained in the first or second embodiment. Therefore, it is not necessary to provide the memory cell block 700 with new test memory cell unit 103 or test auxiliary memory cell unit 301 having the configuration as described in the first or second embodiment. As a result, with the present embodiment, the increase in the memory cell surface area in the memory cell block 700 due to installation of test memory cell unit 103 or test auxiliary memory cell unit 301 can be prevented.

Further, in the present embodiment, because the redundancy memory cell unit 701 of memory cell block 700 has the above-described configuration, the memory cell block 700 is configured and operates identically to the memory cell block 100 of the first embodiment and memory cell block 200 of the second embodiment. As a result, this embodiment also can produce the effect identical to that of the first and second embodiments.

The configuration and operation of redundancy memory cell 701 of the present embodiment are not limited to the above-described configuration and operation. Therefore, with the present embodiment, any number of redundancy memory cell units 701 can be provided in the memory cell block 700.

What is claimed is:

1. A semiconductor memory device comprising:

a memory cell block which includes a memory cell unit having a plurality of memory cells each containing a ferroelectric capacitor, and a test memory cell unit having a plurality of test memory cells, wherein a layout pattern of said test memory cells is identical to a layout pattern of said memory cells, and wherein said test memory cell unit is provided adjacently to said memory cell unit; and a sense amplifier externally connected to said memory cell block, wherein said plurality of memory cells and said plurality of test memory cells are arranged in a same number of rows, said memory cell block comprises a plurality of test auxiliary memory cell units, said test auxiliary memory cell units each comprise a plurality of test auxiliary memory cells arranged in said same number of rows, a layout pattern of said test auxiliary memory cells is identical to the layout pattern of said memory cells, and each of said plurality of test auxiliary memory cells is activated by an activation signal which is externally input to said test auxiliary memory cell units, and is connected to said sense amplifier by a bit line which is common with each of the plurality of memory cells and each of the plurality of test memory cells contained in a same row.

2. The semiconductor memory device according to claim 1, wherein said memory cell block comprises a redundancy memory cell unit; and said redundancy memory cell unit is one at said test auxiliary memory cell units, and said test auxiliary memory cells are redundancy memory cells.

3. The semiconductor memory device according to claim 2, wherein said redundancy memory cell unit has first and second redundancy memory cell units;

said first redundancy memory cell unit is a reserve circuit; and said second redundancy memory cell unit is the one of said test auxiliary memory cell units.

4. The semiconductor memory device according to claim 1, wherein said test auxiliary memory cell units are arranged on a central portion of said memory cell block.

5. The semiconductor memory device according to claim 1, wherein said test auxiliary memory cell units are arranged at a portion of said memory cell block where the ferroelectric capacitor is not readily susceptible to degradation.

6. A semiconductor memory device comprising:

a memory cell block which includes a memory cell unit having a plurality of memory cells each containing a ferroelectric capacitor, and a test memory cell unit having a plurality of test memory cells, wherein a layout pattern of said test memory cells is identical to a layout pattern of said memory cells, and said test memory cell unit is provided adjacently to said memory cell unit, said memory cell block comprises a redundancy memory cell unit, and said redundancy memory cell unit is said test memory cell unit, and said test memory cells are redundancy memory cells.

7. The semiconductor memory device according to claim 6, wherein said redundancy memory cell unit has first and second redundancy memory cell units;

said first redundancy memory cell unit is a reserve circuit; and said second redundancy memory cell unit is said test memory cell unit.

8. A semiconductor memory device which is provided with a memory cell block comprising a memory cell unit having a plurality of memory cells each containing a ferroelectric capacitor, and a test memory cell unit having a plurality of test memory cells, a layout pattern of said test memory cells being identical to a layout pattern of said memory cells, and said test memory cell unit being provided adjacently to said memory cell unit, wherein said semiconductor memory device is subjected to a screening test such that:

a first screening test is conducted on both said memory cell unit and said test memory cell unit, and then a second screening test is conducted only on said test memory cell unit, a total number of test cycles of the first and second screening tests corresponding to an assurance number of cycles.

9. The semiconductor memory device according to claim 8, wherein said first and second screening tests are any of a cycling test, an imprint test, and a retention test.

10. The semiconductor memory device according to claim 8, wherein when said first and second screening tests are cycling tests, said cycling tests are conducted by using together a voltage accelerated test and a simultaneous measurement test.

11. In a semiconductor memory device provided with a memory cell block comprising a memory cell unit having a plurality of memory cells each containing a ferroelectric capacitor, and a test memory cell unit having a plurality of test memory cells, a layout pattern of the test memory cells being identical to a layout pattern of the memory cells, and the test memory cell unit being provided adjacently to said memory cell unit, a screening test comprising:

a first screening test conducted on both the memory cell unit and the test memory cell unit; and a second screening test conducted only on the test memory cell unit, a total number of test cycles of the first and second screening tests corresponding to an assurance number of cycles.

12. The screening test according to claim 11, wherein said first and second screening tests are any of a cycling test, an imprint test, and a retention test.

13. The screening test according to claim 11, wherein the first and second screening tests are cycling tests, each comprising a voltage accelerated test and a simultaneous measurement test.

* * * * *